(12) United States Patent
Lee et al.

(10) Patent No.: US 9,651,686 B2
(45) Date of Patent: May 16, 2017

(54) X-RAY DETECTORS HAVING PHOTOCONDUCTORS INCLUDING CURRENT RESISTANCE LAYERS

(71) Applicant: Samsung Electronics Co., Ltd., Suwon-si, Gyeonggi-do (KR)

(72) Inventors: Byungkyu Lee, Seoul (KR); Duhyun Lee, Yongin-si (KR); Jaechul Park, Yangju-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 14/808,381

(22) Filed: Jul. 24, 2015

(65) Prior Publication Data

US 2016/0103234 A1    Apr. 14, 2016

(30) Foreign Application Priority Data

Oct. 13, 2014  (KR) .................. 10-2014-0137854

(51) Int. Cl.
*H01L 27/146*   (2006.01)
*G01T 1/24*     (2006.01)

(52) U.S. Cl.
CPC ............ *G01T 1/247* (2013.01); *G01T 1/24* (2013.01); *H01L 27/14634* (2013.01); *H01L 27/14636* (2013.01); *H01L 27/14676* (2013.01)

(58) Field of Classification Search
CPC ..................................... G01T 1/247
USPC ......... 250/370.13, 370.08, 370.1, 370.14, 250/370.09
See application file for complete search history.

(56) References Cited

U.S. PATENT DOCUMENTS

| | | | |
|---|---|---|---|
| 5,196,702 A * | 3/1993 | Tsuji ................. | H04N 5/32 250/591 |
| 5,892,227 A | 4/1999 | Schieber et al. | |
| 2005/0184320 A1 | 8/2005 | Green et al. | |
| 2012/0211663 A1* | 8/2012 | Kim ............... | H01L 27/14632 250/370.13 |

FOREIGN PATENT DOCUMENTS

KR    101322331 B1    10/2013

\* cited by examiner

*Primary Examiner* — David Porta
*Assistant Examiner* — Carolyn Igyarto

(57) ABSTRACT

An X-ray detector includes a substrate, a plurality of pixel electrodes on the substrate, a photoconductor covering the plurality of pixel electrodes, or a common electrode on the photoconductor. The photoconductor includes at least two photoconductor layers. The photoconductor may also include a current resistance layers disposed between the at least two photoconductor layers. The current resistance layer is configured to reduce current flow between the at least two photoconductor layers.

15 Claims, 3 Drawing Sheets

X-RAY DETECTORS HAVING PHOTOCONDUCTORS INCLUDING CURRENT RESISTANCE LAYERS

CROSS-REFERENCE TO RELATED APPLICATION(S)

This application claims priority from Korean Patent Application No. 10-2014-0137854, filed on Oct. 13, 2014, in the Korean Intellectual Property Office (KIPO), the entire contents of which are incorporated herein by reference.

BACKGROUND

1. Field

Some example embodiments may generally relate to X-ray detectors having photoconductors including current resistance layers.

2. Description of Related Art

An X-ray detector that includes a thin film transistor may have drawn attention for use as a medical diagnosis device. An X-ray detector may output an X-ray image or an X-ray transparent image taken by using X-rays as a digital signal. X-ray detectors may be divided into direct-type X-ray detectors and indirect-type X-ray detectors.

In direct-type X-ray detectors, X-rays may be directly converted into charges by photoconductors, and in indirect-type X-ray detectors, after converting X-rays into visible light by using scintillators, the converted visible light may be converted into charges by using optical transducers, such as photodiodes.

Direct-type X-ray detectors may include photoconductors that generate electron-hole pairs by X-ray irradiation and pixel electrodes that receive charges from the photoconductor.

Materials used to form the photoconductor may include, for example, $HgI_2$. Since $HgI_2$ with a small thickness may easily absorb X-rays due to its large atomic number and ionization energy by X-rays may be very small, $HgI_2$ may be used as a photoconductor material. However, $HgI_2$ may have a high electrical conductivity and, thus, a current leakage that is generated during an X-ray measuring process may occur in the photoconductor. Also, since an amount of current that flows through the photoconductor may be large when a bias voltage is applied thereto before X-ray detection, the amount of current that is generated during X-ray detection may be relatively small and, thus, the X-ray detection efficiency may be low.

SUMMARY

Some example embodiments may provide X-ray detectors having increased detection efficiency due to current resistance layers in the photoconductors.

In some example embodiments, an X-ray detector may comprise: a substrate; a plurality of pixel electrodes on the substrate; a photoconductor covering the plurality of pixel electrodes; and/or a common electrode on the photoconductor. The photoconductor may comprise: at least two photoconductor layers; and/or a current resistance layer, between the at least two photoconductor layers, configured to reduce current flow between the at least two photoconductor layers.

In some example embodiments, the at least two photoconductor layers may comprise: a first photoconductor layer configured to cover the plurality of pixel electrodes; and/or a second photoconductor layer on the current resistance layer.

In some example embodiments, the current resistance layer may comprise material having smaller electrical conductivity than the at least two photoconductor layers.

In some example embodiments, the current resistance layer may comprise alumina, silicon oxide, silicon nitride, parlyene, or conductive polymer.

In some example embodiments, the first photoconductor layer may comprise amorphous selenium (a-Se), $HgI_2$, $PbI_2$, CdTe, CdZnTe, or PbO. The second photoconductor layer may comprise amorphous selenium (a-Se), $HgI_2$, $PbI_2$, CdTe, CdZnTe, or PbO.

In some example embodiments, the first and second photoconductor layers may comprise different materials from each other.

In some example embodiments, the current resistance layer may be further configured to prevent the first photoconductor layer from contacting the second photoconductor layer.

In some example embodiments, a number of the at least two photoconductor layers may be 3 to 15. The 3 to 15 photoconductor layers may be stacked with 2 to 14 current resistance layers respectively formed between adjacent photoconductor layers of the 3 to 15 photoconductor layers.

In some example embodiments, the current resistance layer may comprise material having smaller electrical conductivity than each of the 3 to 15 photoconductor layers.

In some example embodiments, the current resistance layers may comprise alumina, silicon oxide, silicon nitride, parlyene, or conductive polymer.

In some example embodiments, at least one of the 2 to 14 current resistance layers may comprise material different from the other current resistance layers.

In some example embodiments, each of the photoconductor layers may comprise amorphous selenium (a-Se), $HgI_2$, $PbI_2$, CdTe, CdZnTe, or PbO.

In some example embodiments, each of the current resistance layers may be configured to prevent the photoconductor layers on opposite sides of the respective current resistance layer from contacting each other.

In some example embodiments, the X-ray detector may further comprise: a protection layer on the common electrode configured to cover side surfaces of the photoconductor layer and a side surface of the common electrode.

In some example embodiments, the X-ray detector may further comprise: a plurality of chips under the substrate, the plurality of chips including first contacts electrically connected to the plurality of pixel electrodes; and/or a printed circuit board (PCB) electrically connected to second contacts on a bottom surface of the plurality of chips. The plurality of chips may be on the PCB.

In some example embodiments, an X-ray detector may comprise: a plurality of photoconductor layers; and/or a current resistance layer, between the plurality of photoconductor layers, configured to reduce current flow between the plurality of photoconductor layers.

In some example embodiments, the current resistance layer may comprise material having smaller electrical conductivity than each of the plurality of photoconductor layers.

In some example embodiments, the current resistance layer may comprise alumina, silicon oxide, silicon nitride, parlyene, or conductive polymer.

In some example embodiments, the plurality of photoconductor layers may comprise amorphous selenium (a-Se), $HgI_2$, $PbI_2$, CdTe, CdZnTe, or PbO.

In some example embodiments, a number of the photoconductor layers may be 2 to 15.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Figure 1:
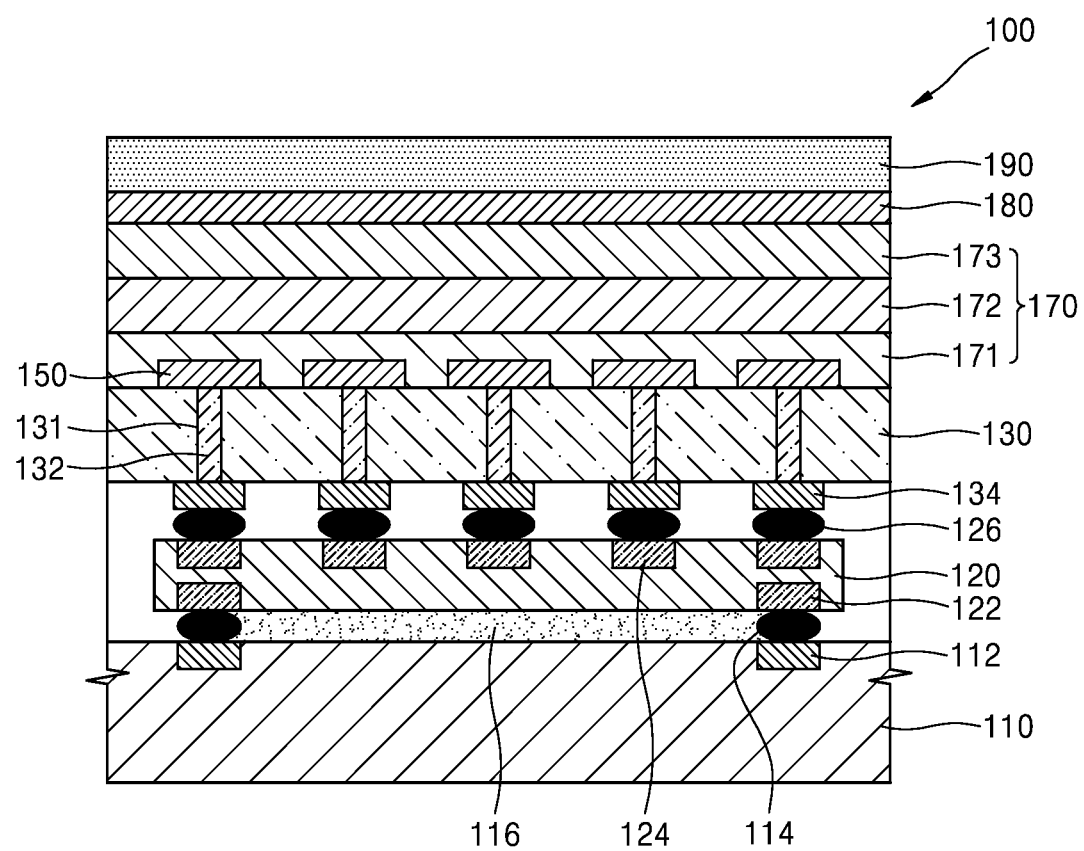
FIG. 1 is a schematic cross-sectional view of an X-ray detector having a photoconductor that includes a current resistance layer according to some example embodiments.

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting of example embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Example embodiments may be described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will typically have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature, their shapes are not intended to illustrate the actual shape of a region of a device, and their shapes are not intended to limit the scope of the example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Although corresponding plan views and/or perspective views of some cross-sectional view(s) may not be shown, the cross-sectional view(s) of device structures illustrated herein provide support for a plurality of device structures that extend along two different directions as would be illustrated in a plan view, and/or in three different directions as would be illustrated in a perspective view. The two different directions may or may not be orthogonal to each other. The three different directions may include a third direction that may be orthogonal to the two different directions. The plurality of device structures may be integrated in a same electronic device. For example, when a device structure (e.g., a memory cell structure or a transistor structure) is illustrated in a cross-sectional view, an electronic device may include a plurality of the device structures (e.g., memory cell structures or transistor structures), as would be illustrated by a plan view of the electronic device. The plurality of device structures may be arranged in an array and/or in a two-dimensional pattern.

Reference will now be made to example embodiments, which are illustrated in the accompanying drawings, wherein like reference numerals may refer to like components throughout.

FIG. 1 is a schematic cross-sectional view of an X-ray detector 100 having a photoconductor that includes a current resistance layer according to some example embodiments.

Referring to FIG. 1, the X-ray detector 100 includes a plurality of chips, a substrate 130, a plurality of pixel electrodes 150, a photoconductor 170, a common electrode 180, and a protection layer 190 that are sequentially formed on a printed circuit board (PCB) 110 in the stated order.

The chips are disposed in an array on the PCB 110. In FIG. 1, for convenience of explanation, a single chip 120 is depicted. A plurality of first contacts 112 are formed in the PCB 110.

The chip 120 may be an application-specific integrated circuit (ASIC). A plurality of second contacts 122 are formed in a lower part of the chip 120 and a plurality of third contacts 124 are formed in a upper part of the chip 120. A plurality of first bumps 114 is formed between the second contacts 122 of the chip 120 and the first contacts 112 of the PCB 110 to electrically connect the second contacts 122 and the first contacts 112.

The chip 120 may be formed of mono-crystal silicon. In this case, the chip 120 formed of mono-crystal silicon is characterized by high operation speed and low noise. Also, the chip 120 formed of mono-crystal silicon may increase a primarily processing speed of an electrical signal from the photoconductor 170 and may transmit the processed electrical signal to the PCB 110.

Due to limitations of masks used in semiconductor processes, the chip 120 may be formed to a maximum size of approximately 2 centimeters (cm)×2 cm. A single chip 120 may include approximately a few tens to a few hundreds of thousands pixel regions.

The PCB 110 realizes an image signal from the inputted electrical signal by quantifying an X-ray transmittance of an object to be measured. The chip 120 provides necessary information to the PCB 110 by rapidly processing the electrical signal transmitted from the pixel electrodes 150 and, as a result, a signal processing time in the PCB 110 may be reduced.

A resin 116, for example, an epoxy resin, may be deposited between the PCB 110 and the chip 120 to fix them to each other.

The substrate 130 is formed under the pixel electrodes 150. Through holes 131 are formed in the substrate 130, and first vias 132 may be formed in the through holes 131 by filling a conductive metal in the through holes 131. The first vias 132 may be formed to be connected to the pixel electrodes 150. The first vias 132 may be formed of copper or aluminum.

Figure 2:
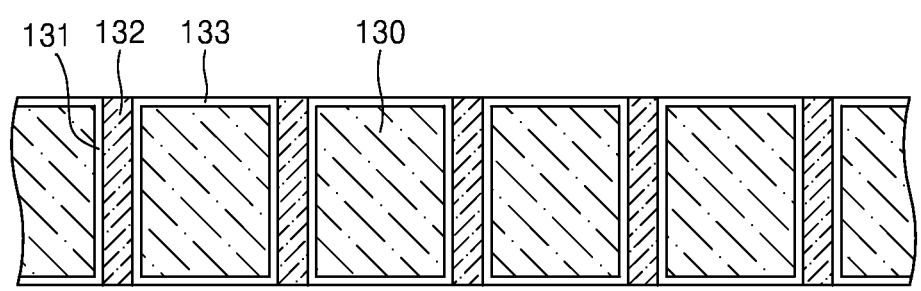
FIG. 2 is a cross-sectional view of a modified substrate of FIG. 1.

The substrate 130 may be a non-conductive substrate. However, example embodiments are not limited thereto. The substrate 130 may be a conductive substrate, for example, a silicon substrate. If the substrate 130 is a conductive substrate, the first vias 132 are formed to be insulated from the substrate 130. For example, as depicted in FIG. 2, a silicon oxide layer 133 that is formed by oxidizing a silicon substrate is formed on surfaces of the through holes 131 and the substrate 130. In the through holes 131, the first vias 132 are formed in the silicon oxide layer 133.

A plurality of pixel pads 134 is formed on a bottom surface of the substrate 130. The pixel pads 134 are electrically connected to the first vias 132. A plurality of second bumps 126 is formed between the third contacts 124 of the chip 120 and the plurality of pixel pads 134. A gap between the substrate 130 and the chip 120 may be filled with an insulating layer (not shown).

The pixel electrodes 150 are formed on the substrate 130. The pixel electrodes 150 are electrically connected to the first vias 132.

The photoconductor 170 that covers the pixel electrodes 150 is formed on the substrate 130. The photoconductor 170 includes a first photoconductor layer 171 that covers the pixel electrodes 150, and a current resistance layer 172 and a second photoconductor layer 173 that are sequentially formed on the first photoconductor layer 171. The current resistance layer 172 prevents the first photoconductor layer 171 from contacting the second photoconductor layer 173.

The first and second photoconductor layers 171 and 173 may include amorphous selenium (a-Se), $HgI_2$, $PbI_2$, CdTe, CdZnTe, or PbO. The first and second photoconductor layers 171 and 173 may not be necessarily formed of the same material. For example, the first and second photoconductor layers 171 and 173 may be formed of materials different from each other.

The first and second photoconductor layers 171 and 173 respectively may be formed to a thicknesses of approximately a few tens of microns (μm) (e.g., about 10, 11, 12, 13, 14, . . . , 37, 38, 39, or 40 μm.

The current resistance layer 172 may be formed of a material having smaller electrical conductivity than the first and second photoconductor layers 171 and 173. The current resistance layer 172 may be formed of an inorganic material, such as alumina, silicon oxide, or silicon nitride, parylene (e.g., poly(p-xylylene) polymer), or conductive polymer. The thickness of the current resistance layer 172 may vary according to the dielectric constant of the current resistance layer 172. For example, if the current resistance layer 172 is formed of an inorganic material or parylene, the current resistance layer 172 may be formed to have a thickness in a range from about a few nanometers (nm) (e.g., about 1, 2, 3, or 4 nm) to about 20 nm. If the current resistance layer 172 is formed of a conductive polymer, the current resistance layer 172 may be formed to have a thickness in a range from about a few μm to about a few tens of μm (e.g., about 1, 2, 3, 4, . . . , 37, 38, 39, or 40 μm).

The common electrode 180 is formed to cover the photoconductor 170. The common electrode 180 may be formed of a thin metal electrode material formed of aluminum, copper, ruthenium, palladium, etc.

The protection layer 190 covers an upper surface of the common electrode 180. Although not shown in FIG. 1, the protection layer 190 may further cover side surfaces of the photoconductor 170 and the common electrode 180. The protection layer 190 may be formed of parylene.

An operation of the X-ray detector 100 according to some example embodiments will be described with reference to FIG. 1.

An electric field is formed in the photoconductor 170 according to direct current applied to the common electrode 180. The photoconductor 170 generates charges in response to the intensity of X-rays incident from an upper surface of the photoconductor 170. The photoconductor 170 includes a plurality of pixel regions. The pixel electrodes 150 may be formed to correspond to the plurality of the pixel regions. The charges generated from the photoconductor 170 are collected to the corresponding pixel electrode 150. That is, an electrical signal of the pixel region is transmitted to the corresponding third contact 124 of the chip 120 through the first via 132. The chip 120 may rapidly process the electrical signal inputted from the pixel electrode 150 and may transmit processed information to the PCB 110. The PCB 110 generates an image signal from the inputted electrical signal by quantifying an X-ray transmittance of an object to be measured.

The current resistance layer 172 controls a current that excessively flow (referred to as "dark current") in the photoconductor 170 when a bias voltage is applied thereto and, thus, allows the photoconductor 170 to correctly measure the electrical signal that is generated when an X-ray is detected. That is, in the X-ray detector 100 according to some example embodiments, a ratio of a measured current to a dark current is increased and, accordingly, the signal-to-noise ratio (SNR) is improved.

Figure 3:
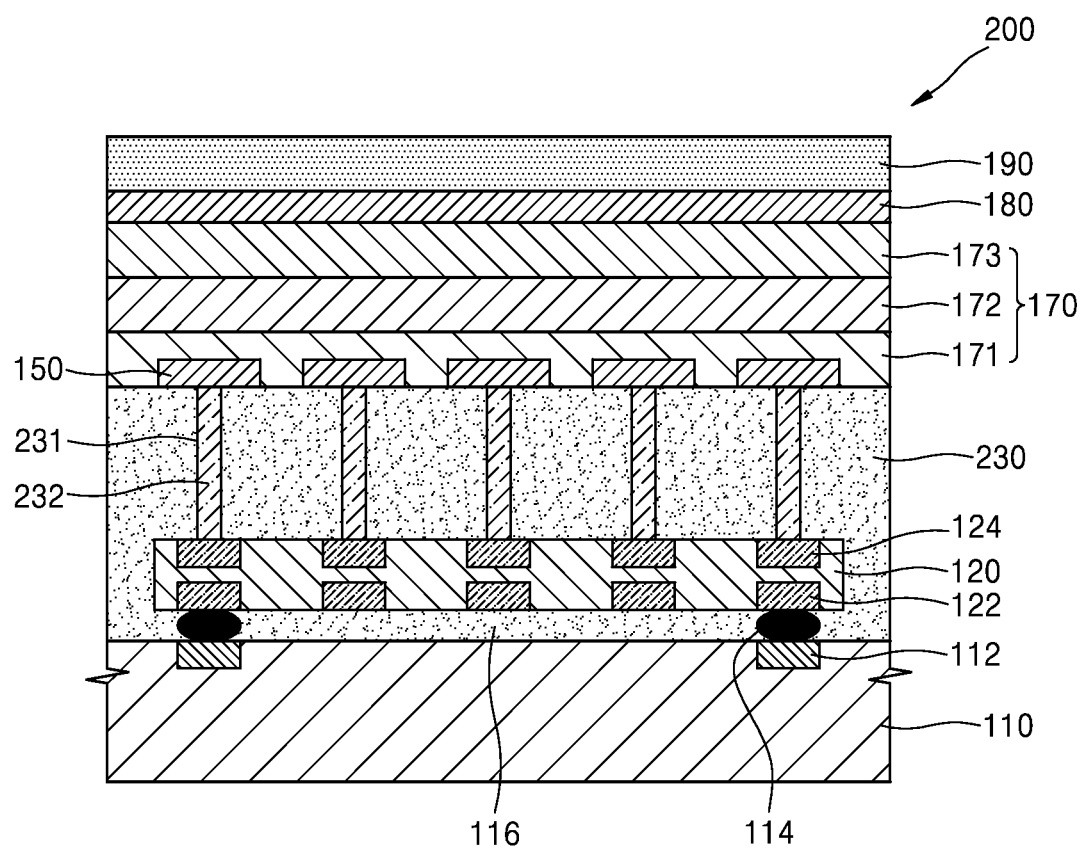
FIG. 3 is a schematic cross-sectional view of an X-ray detector having a photoconductor that includes a current resistance layer according to some example embodiments.

FIG. 3 is a schematic cross-sectional view of an X-ray detector 200 having a photoconductor 170 that includes a current resistance layer 172 according to some example embodiments. Like reference numerals are used to indicate elements that are substantially identical to the elements of the X-ray detector 100 of FIG. 1 and, thus, the detailed descriptions thereof will not be repeated.

Referring to FIG. 3, the X-ray detector 200 has a structure not including the substrate 130 of the X-ray detector 100. A planarizing film 230 that covers chips 120 is formed on a PCB 110. The planarizing film 230 may be formed of a polymer, for example, SU-8 photoresist (e.g., Sukhoi-8, epoxy-based negative photoresist) or polyimide. The planarizing film 230 may be referred to as a substrate.

Via holes 231 that expose third contacts 124 of the chip 120 are formed in the planarizing film 230. The via holes 231 are filled with via metal 232. The via metal 232 may be formed of aluminum, copper, etc.

An electrical signal is transmitted to the chip 120 from a pixel electrode 150 through the via metal 232.

The other structures and operations of the X-ray detector 200 of FIG. 3 may be understood from the previous descriptions.

Figure 4:
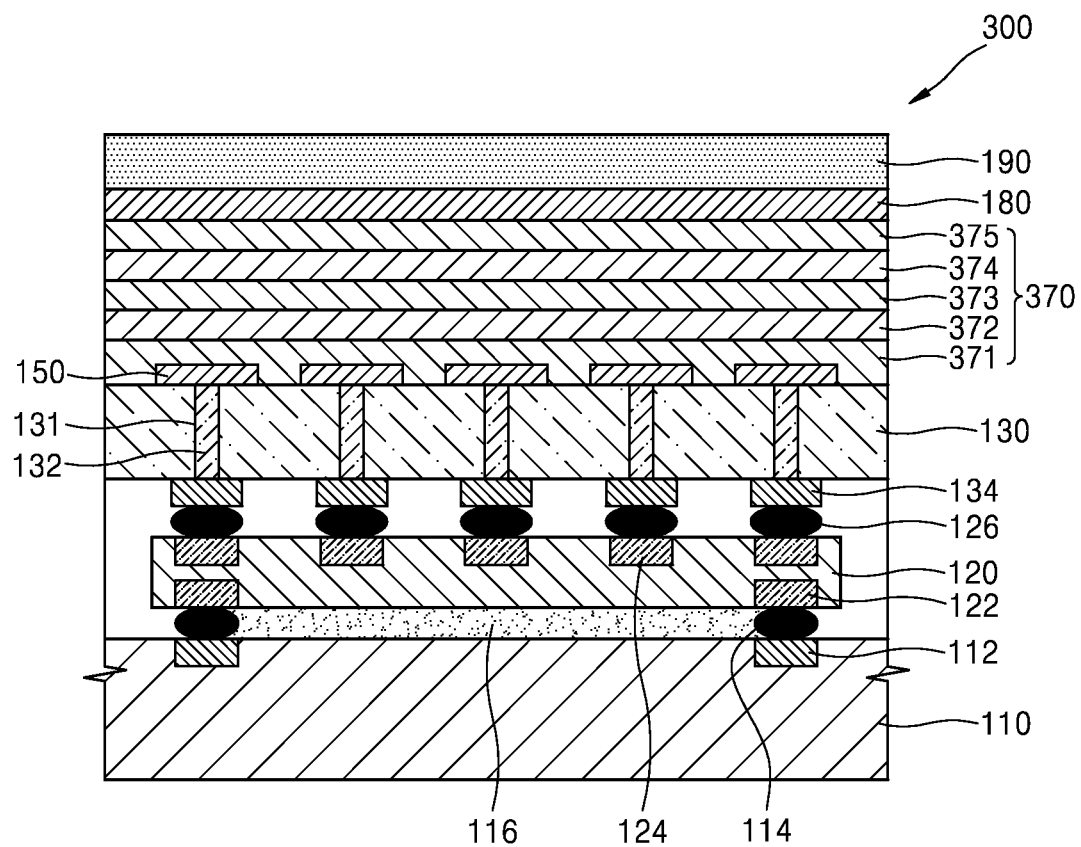
FIG. 4 is a schematic cross-sectional view of an X-ray detector having a photoconductor that includes a current resistance layer according to some example embodiments.

FIG. 4 is a schematic cross-sectional view of an X-ray detector 300 having a photoconductor that includes a current resistance layer according to some example embodiments. Like reference numerals are used to indicate elements that are substantially identical to the elements of the X-ray detector 100 of FIG. 1 and, thus, the detailed descriptions thereof will not be repeated.

A photoconductor 370 covering pixel electrodes 150 is formed on a substrate 130. The photoconductor 370 includes a first photoconductor layer 371 that covers the pixel electrodes 150, and a first current resistance layer 372, a second photoconductor layer 373, a second current resistance layer 374, and a third photoconductor layer 375 that are sequentially formed on the first photoconductor layer 371. The first current resistance layer 372 prevents the first photoconductor layer 371 from contacting the second photoconductor layer 373, and the second current resistance layer 374 prevents the second photoconductor layer 373 from contacting the third photoconductor layer 375.

The first photoconductor layer 371, the second photoconductor layer 373, and the third photoconductor layer 375 may include amorphous selenium (a-Se), $HgI_2$, $PbI_2$, CdTe, CdZnTe, or PbO. The first photoconductor layer 371, the second photoconductor layer 373, and the third photoconductor layer 375 may not be necessarily formed of the same material. For example, the first photoconductor layer 371, the second photoconductor layer 373, and the third photoconductor layer 375 may be formed of different materials from each other.

The first photoconductor layer 371, the second photoconductor layer 373, and the third photoconductor layer 375 may have a thickness in a range from about a few μm to about a few tens of μm (e.g., about 1, 2, 3, 4, . . . , 37, 38, 39, or 40 μm).

The first and second current resistance layers 372 and 374 may be formed of a material having an electrical conductivity smaller than that of the first through third photoconductor layers 371, 373, and 375. The first and second current resistance layers 372 and 374 may be formed of an inorganic material, such as alumina, silicon oxide, or silicon nitride, parylene, or conductive polymer. The first and second current resistance layers 372 and 374 may be formed of different materials from each other.

The thicknesses of the first and second current resistance layers 372 and 374 may vary according to a dielectric constant of the first and second current resistance layers 372 and 374. For example, if the first and second current resistance layers 372 and 374 are formed of an inorganic material or parylene, the first and second current resistance layers 372 and 374 may have a thickness in a range from about a few nm (e.g., about 1, 2, 3, or 4 nm) to about 20 nm. If the first and second current resistance layers 372 and 374 are formed of a conductive polymer, the first and second current resistance layers 372 and 374 may have a thickness in a range from about a few μm to about a few tens of μm (e.g., about 1, 2, 3, 4, . . . , 37, 38, 39, or 40 μm).

The common electrode 180 is formed to cover the photoconductor 370. The common electrode 180 may be formed of indium-tin-oxide (ITO) or a very thin metal electrode material formed of aluminum, copper, ruthenium, palladium, etc.

The protection layer 190 covers an upper surface of the common electrode 180. Although not shown in FIG. 4, the protection layer 190 may further cover side surfaces of the photoconductor 370 and the common electrode 180. The protection layer 190 may be formed of parylene.

The first through third photoconductor layers 371, 373, and 375 of the photoconductor 370 may be sequentially formed by an evaporation deposition method. The evaporation deposition method may include a sputtering method, evaporation method, atomic layer deposition method, or chemical vapor deposition method.

According to the X-ray detector 300 described above, photoconductor layers may be uniformly formed and, accordingly, the X-ray detection characteristic of the X-ray detector 300 may be improved.

In the example embodiments described above, the photoconductor 370 includes three photoconductor layers and two current resistance layers. However, the photoconductor 370 according to example embodiments is not limited thereto, and for example, the photoconductor may include 4 to 15 photoconductor layers and 3 to 14 current resistance layers respectively disposed between the adjacent ones of the 4 to 15 photoconductor layers, and at least one of the current resistance layers may be formed of a different material from the other current resistance layers.

According to some example embodiments, an X-ray detector includes a photoconductor that includes a current resistance layer that reduce a dark current generated in the photoconductor and, accordingly, an SNR of the X-ray detector is increased.

Also, a plurality of photoconductor layers and a plurality of current resistance layers between the plural photoconductor layers may be uniformly formed and, thus, an X-ray detection characteristic of the X-ray detector may be increased.

It should be understood that the example embodiments described herein should be considered in a descriptive sense only and not for purposes of limitation. Descriptions of features or aspects within each embodiment should typically be considered as available for other similar features or aspects in other embodiments.

Although example embodiments have been shown and described, it would be appreciated by those skilled in the art that changes may be made in these example embodiments without departing from the principles and spirit of the disclosure, the scope of which is defined by the claims and their equivalents.

What is claimed is:

1. An X-ray detector, comprising:
   a substrate;
   a plurality of pixel electrodes on the substrate;
   a photoconductor formed on the substrate and covering the plurality of pixel electrodes; and
   a common electrode on the photoconductor;
   wherein the photoconductor comprises:
      at least two photoconductor layers;
      a current resistance layer disposed between the at least two photoconductor layers, the current resistance layer comprising an inorganic material and configured to reduce current flow between the at least two photoconductor layers; and
   wherein the at least two photoconductor layers comprise:
      a first photoconductor layer configured to cover the plurality of pixel electrodes, wherein at least a portion of the first photoconductor layer is disposed in contact with the substrate.

2. The X-ray detector of claim 1, wherein the at least two photoconductor layers further comprise:
   a second photoconductor layer on the current resistance layer.

3. The X-ray detector of claim 2, wherein the first photoconductor layer comprises amorphous selenium (a-Se), Hgli, Pbl$_2$, CdTe, CdZnTe, or PbO, and wherein the second photoconductor layer comprises amorphous selenium (a-Se), HgI$_2$, PbI$_2$, CdTe, CdZnTe, or PbO.

4. The X-ray detector of claim 2, wherein the first and second photoconductor layers comprise different materials from each other.

5. The X-ray detector of claim 2, wherein the current resistance layer is further configured to prevent the first photoconductor layer from contacting the second photoconductor layer.

6. The X-ray detector of claim 1, wherein the inorganic material comprises: a material having smaller electrical conductivity than the at least two photoconductor layers.

7. The X-ray detector of claim 1, wherein the inorganic material comprises alumina, silicon oxide, silicon nitride, parlyene, or conductive polymer.

8. The X-ray detector of claim 1, wherein the at least two photoconductor comprises: at least three photoconductor layers; and
   no more than fifteen photoconductor layers.

9. The X-ray detector of claim 8, wherein the photoconductor comprises:
   at least two current resistance layers; and
   no more than fourteen current resistance layers.

10. The X-ray detector of claim 9, wherein each of the current resistance layers are respectively stacked between two adjacent photoconductor layers of the at least three photoconductor layers.

11. The X-ray detector of claim 8, wherein at least one layer of the current resistance layers comprises material different from the other current resistance layers.

12. The X-ray detector of claim 1, wherein the substrate comprises through holes, wherein the through holes include vias comprising a conductive material.

13. The X-ray detector of claim 1, wherein each of the pixel electrodes is configured to align with and couple to a respective via in a corresponding through hole.

14. The X-ray detector of claim 1, further comprising:
   a protection layer on the common electrode configured to cover a side surface of the photoconductor and a side surface of the common electrode.

15. The X-ray detector of claim 1, further comprising:
   a plurality of chips disposed under the substrate, each of the plurality of chips including first contacts electrically connected through vias to the plurality of pixel electrodes; and
   a printed circuit board (PCB) electrically connected to second contacts on a bottom surface of the plurality of chips,
   wherein the plurality of chips are on the PCB.

* * * * *